(12) United States Patent
Roset et al.

(10) Patent No.: US 7,500,888 B2
(45) Date of Patent: Mar. 10, 2009

(54) BATTERY POST CONNECTOR

(75) Inventors: Josep M. Roset, Valls (ES); Enric Aparicio, Valls (ES)

(73) Assignee: Lear Corporation, Southfield, MI (US)

( * ) Notice: Subject to any disclaimer, the term of this patent is extended or adjusted under 35 U.S.C. 154(b) by 7 days.

(21) Appl. No.: 11/672,715

(22) Filed: Feb. 8, 2007

(65) Prior Publication Data
US 2008/0194152 A1    Aug. 14, 2008

(51) Int. Cl.
H01R 4/28    (2006.01)
(52) U.S. Cl. ..................................... 439/754
(58) Field of Classification Search ............... 439/754, 439/762, 763, 758, 428; 320/105, 128; 307/10.1
See application file for complete search history.

(56) References Cited

U.S. PATENT DOCUMENTS

| | | | |
|---|---|---|---|
| 4,675,255 A | 6/1987 | Pfeifer et al. | |
| 5,645,448 A | 7/1997 | Hill | |
| 5,903,154 A | 5/1999 | Zhang et al. | |
| 5,939,861 A | 8/1999 | Joko et al. | |
| 6,218,805 B1 | 4/2001 | Melcher | |
| 6,304,062 B1 | 10/2001 | Batson | |
| 6,551,147 B2 | 4/2003 | Wakata et al. | |
| 6,573,723 B2 | 6/2003 | Baston | |
| 6,628,102 B2 | 9/2003 | Batson | |
| 6,787,935 B2 | 9/2004 | Heim | |
| 6,918,800 B2 * | 7/2005 | Ota et al. ............. | 439/886 |
| 6,943,455 B1 | 9/2005 | Maxwell | |
| 7,039,533 B2 | 5/2006 | Bertness et al. | |
| 7,081,755 B2 | 7/2006 | Klang et al. | |
| 2001/0023037 A1 | 9/2001 | Kieninger et al. | |
| 2001/0033171 A1 | 10/2001 | Batson | |
| 2002/0180405 A1 | 12/2002 | Batson | |
| 2002/0182493 A1 | 12/2002 | Ovshinsky et al. | |
| 2003/0038637 A1 | 2/2003 | Bertness et al. | |
| 2003/0054700 A1 * | 3/2003 | Korte et al. ............. | 439/762 |
| 2003/0057770 A1 | 3/2003 | Heim | |
| 2003/0203681 A1 | 10/2003 | Liang | |
| 2003/0232546 A1 | 12/2003 | Davis | |
| 2003/0236033 A1 | 12/2003 | Freitag | |
| 2004/0048142 A1 | 3/2004 | Marusak et al. | |
| 2004/0087219 A1 | 5/2004 | Freitag | |
| 2004/0232918 A1 | 11/2004 | Bertness et al. | |
| 2005/0014408 A1 | 1/2005 | Swiatek et al. | |
| 2005/0035737 A1 | 2/2005 | Elder et al. | |
| 2005/0058892 A1 | 3/2005 | Ovshinsky et al. | |
| 2005/0101197 A1 | 5/2005 | Wirth | |
| 2005/0190519 A1 | 9/2005 | Brown et al. | |
| 2005/0202731 A1 | 9/2005 | Brito | |
| 2005/0264296 A1 | 12/2005 | Philbrook | |
| 2006/0003627 A1 | 1/2006 | Freitag | |

(Continued)

FOREIGN PATENT DOCUMENTS

DE    3532044 A1    3/1987

(Continued)

Primary Examiner—Alexander Gilman
(74) Attorney, Agent, or Firm—Brooks Kushman P.C.

(57) ABSTRACT

A connector suitable for establishing and electrical connection with any number of batteries. The connector including any number of features for assessing operating characteristics associated with the battery, such as but not limited to current, voltage, and temperature. The connector optionally being of a robust design and configured to ameliorate vibrations and forces.

12 Claims, 4 Drawing Sheets

U.S. PATENT DOCUMENTS

| | | |
|---|---|---|
| 2006/0057899 A1 | 3/2006 | Tokunaga |
| 2006/0076466 A1 | 4/2006 | Serra |

FOREIGN PATENT DOCUMENTS

| | | |
|---|---|---|
| DE | 10118027 A1 | 11/2002 |
| DE | 10118051 A1 | 11/2002 |
| DE | 102004055848 A1 | 5/2006 |
| DE | 102004055847 A1 | 6/2006 |
| DE | 102004055849 A1 | 6/2006 |
| WO | 0131718 A2 | 5/2001 |
| WO | 02082617 A1 | 10/2002 |

* cited by examiner

BATTERY POST CONNECTOR

BACKGROUND OF THE INVENTION

1. Field of the Invention

The present invention relates to battery post connectors, such as but not limited to the type having capabilities for sensing and/or reporting battery operating conditions

2. Background Art

A battery post connector may be used to sense battery operating conditions. These type of connectors are commonly employed in automotive vehicles having lead-acid or some other type of battery or similar energy storage device. The connectors may be advantageous in sensing and reporting battery operating conditions for use with a junction box or other vehicle system controller.

As one skilled in the art will appreciate, automotive vehicles and vehicles having batteries may experience any number of forces during operation and manipulation. These forces may induce vibrations and other efforts from the vehicle or from the operators throughout the ground cable. The vibration, in some cases, can disrupt the electrical connection between the battery and battery post connector or the internal electrical connections of the battery post connector in such a manner as to influence the ability of the battery post connector to accurately sense and report the various operating conditions of the battery.

The inability or questionable ability of the connector to accurately sense and report the operating characteristics of the battery can be a particular problematic if the junction box or other vehicle system controller is relying on the accuracy such information when controlling, directing, or otherwise influencing operation of the vehicle or its sub-systems.

BRIEF DESCRIPTION OF THE DRAWINGS

The present invention is pointed out with particularity in the appended claims. However, other features of the present invention will become more apparent and the present invention will be best understood by referring to the following detailed description in conjunction with the accompany drawings in which:

DETAILED DESCRIPTION OF THE PREFERRED EMBODIMENT(S)

Figure 1:
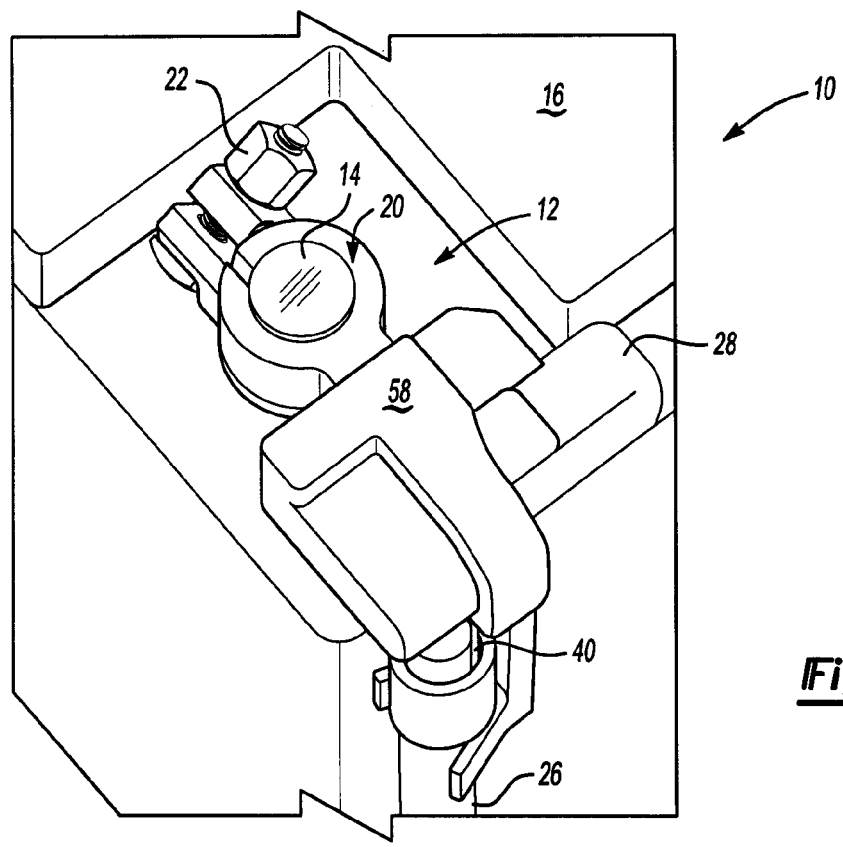
FIG. 1 illustrates a battery post connector system in accordance with one non-limiting aspect of the present invention.

FIG. 1 illustrates a battery post connector system 10 in accordance with one non-limiting aspect of the present invention. A connector 12 may be included and configured for connecting to a battery post 14 of a battery 16, such as but not limited to a lead-acid or other battery commonly employed within vehicles. The connector 12 may be securely connected to the battery post 14 with compressive tightening of a terminal adapter 20 or through another suitable connection. The connector 12 may be configured or otherwise programmed to support any number of connector operations, such as but not limited to measuring/sensing current, voltage, and temperatures associated with the battery 16.

Figure 2:
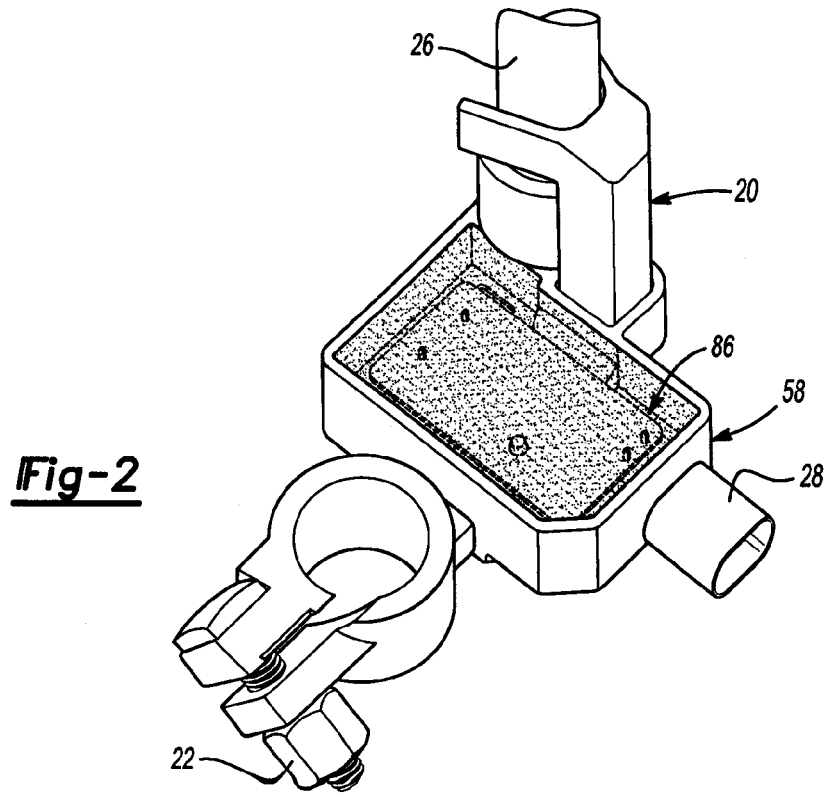
FIG. 2 illustrates an underside of the battery post connector in accordance with one non-limiting aspect of the present invention.

FIG. 2 illustrates an underside of the battery post connector 12 in accordance with one non-limiting aspect of the present invention. The terminal adapter 20, as described below in more detail, may extend outwardly relative to the clamping end used to connect to the battery post 14. The terminal adapter 20 may include a screw or other fastener 22 for compressively applying force against the battery post 14 and for establishing the electrical connection thereto. The terminal adapter 20 is shown for attachment to a cylindrical battery post for exemplary purposes and without intending to limit the scope and contemplation of the present invention. Any type of connection to the battery 16 may be used.

The connector 12 may interface with a cable, wire, or other element 26 suitable for conducting electricity to another element within the vehicle, such as but not limited to a vehicle chassis (not show), grounding element, etc. In this manner, this vehicle connector 26 may be suitable for use in conducting energy between the battery and a vehicle element. The cable 26 may include an outer insulated portion surround a copper or other suitable electrically conducting material.

The connector 12 may further include a network interface 28 for interfacing signals with a network vehicle element, such as but not limited to a vehicle system controller (not shown), junction box, bus, network etc. The network interface 28 may be used to interface any number of signals between the connector 12 and the vehicle system controller or other network vehicle element, i.e., any element not intended to exchange current directly with the battery 16. For example, one or two-way communications may be established with the connector 12, such as but not limited communications associated with sensing and measuring current, voltage, temperature, and other operating parameters associated with the battery, as described in more detail below.

Figure 3:
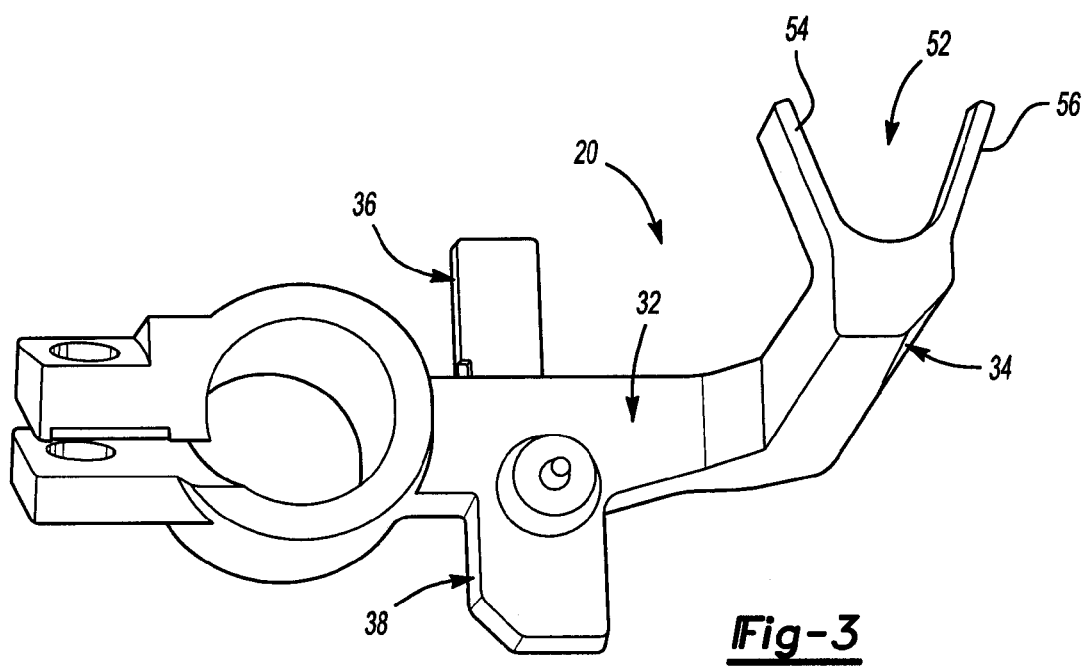
FIG. 3 illustrates a terminal adapter in accordance with one non-limiting aspect of the present invention.

FIG. 3 illustrates the terminal adapter 20 in accordance with one non-limiting aspect of the present invention. The terminal adapter 20 may include a laterally extending portion 32 extending relative to the battery post 14 and a downwardly (shown as upwardly) extending portion 34 extending downwardly relative to the laterally extending portion. The terminal adapter 20 may also include outwardly extending portions 36-38 extending outwardly relative to the laterally extending portion 32. The outwardly extending portions 36-38 are shown for supporting additional elements of the connector 12 and may be configured and otherwise shaped to support the same.

Figure 4:
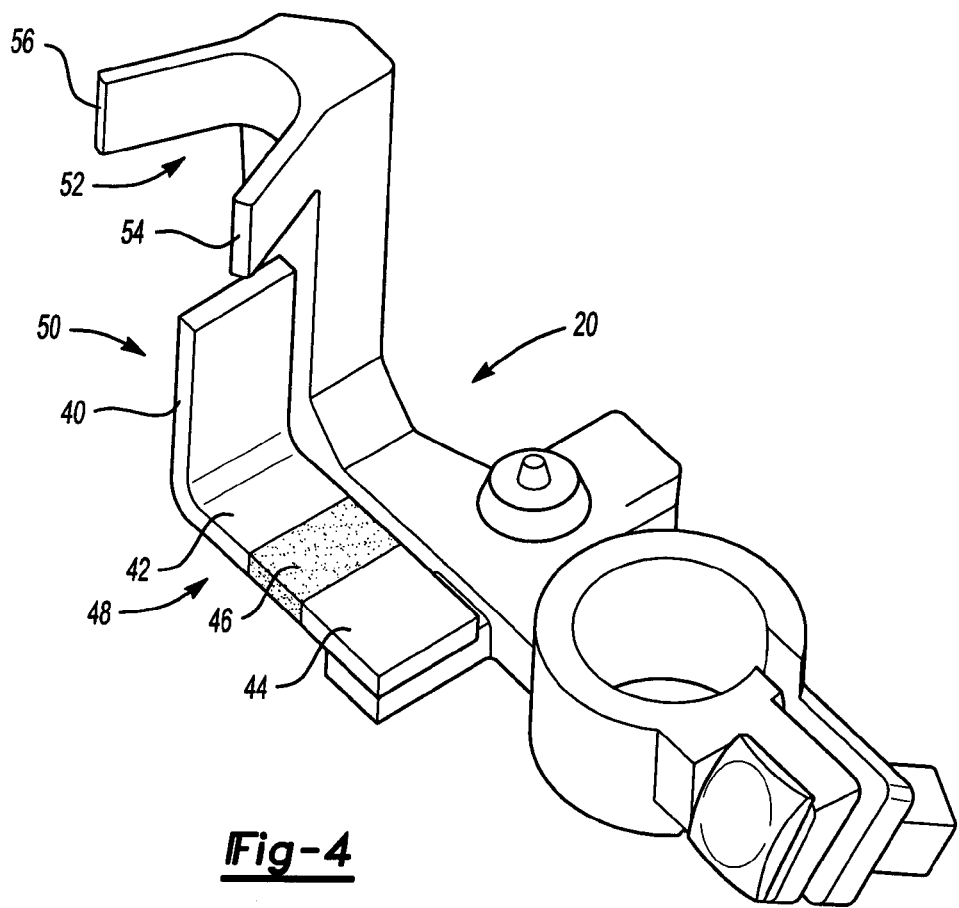
FIG. 4 illustrates a shunt connected to the terminal adapter in accordance with one non-limiting aspect of the present invention.

FIG. 4 illustrates a shunt 40 connected to the terminal adapter 20 in accordance with one non-limiting aspect of the present invention. The shunt 40 may comprise any material have properties sufficient to facilitate electrical connectivity between the terminal adapter 20 and the wire 26. The shunt 40 is shown as a bi-metallic object having copper alloy portions 42-44 and a resistive copper alloy portion 46, such as but not limited to manganin. The copper alloy portions 42-44 correspond with the ends of the shunt 40 and the resistive copper alloy portion 46 may be arranged therebetween such that current must flow from through one copper alloy portion 44, through the resistive copper alloy portion 46, and finally through the other copper alloy portion 42.

The resistive copper alloy portion 46 may be used a measuring element suitable for conducting high currents. Sensing features, which are described below in more detail and not shown in FIG. 4, may be included within or outside the boundaries of the resistor copper alloy portion 46 for use in facilitate sensing of a voltage drop therebetween. The known resistive characteristics of the resistor copper alloy 46 may be used in conjunction with the voltage drop to determine current flow through the shunt. In this manner, the present invention is able to sense voltage and current associated with the battery 16.

The know resistivity of the resistor copper alloy portion 46 is helpful in assuring the accuracy and consistency of the current calculations. Of course, the present is not intended to be limited to the shunt 40 having the resistive copper alloy portion and fully contemplates the use of any number of other suitable materials, including making the shunt out of a single material/composition, i.e., without the bi-metallic composition.

The shunt 40 may be connected, such as by welding or other fastening, to the terminal adapter 20. As shown, the shunt 40 may be connected to the outwardly extending portion 36 of the terminal adapter 20. The shunt 40 may also include corresponding laterally and downwardly extending portions 48-50 for matching the corresponding portions of the terminal adapter 20. This allows the shunt 40 to conduct current traveling though the terminal adapter 20.

Returning to FIG. 2, the terminal adapter 20 may be electrically connected at one end to the battery post 14 and at the other end to a non-conducting portion of the vehicle connector 26. The shunt 40 may be connected at one end to the battery terminal adapter 20 and connected at another end to a conducting portion of the vehicle connector 26. In this manner, both of the terminal adapter 20 and the shunt 40 are connected to the vehicle connector 26 but at different portions, i.e., one at a non-conducting portion and the other at a conducting portion. This allows the present invention to exchange current between the vehicle connector 26 and the battery post 14 by way of the shunt 40 and terminal adapter 20, but without any direct electrical connection between the terminal adapter 20 and vehicle connector 26.

The shunt 40 may be welded, soldered, or otherwise attached to the terminal adapter 20 and the vehicle connector 26. As one skilled in the art will appreciate, these connections be particularly susceptible to vibrations and other forces associated with vehicle operations. For example, the shunt 40 may be soldered to the wire 26 in order to provide a secure mechanical connection, but at the same time this connection may permit vibrations or other forces associated with the vehicle chassis or other vehicle element to travel up the wire to the connector 12. Similar vibrations may be imparted to the connector 12 such that these and other connector elements, some of which are described below in more detail, may be exposed to various vibrations depending on vehicle operations.

The receptivity of the connector 12 to these and other vibrations can become problematic for the electronic elements, connections, and other features of the connector 12 that are used to perform the various operations associated with determining battery current, voltage, temperatures, etc. Accordingly, one non-limiting aspect of the present invention relates to ameliorating these vibrations and improving the robustness of the connector. A clamp portion 52 at the end of the terminal adapter 20 connected to the non-conducting portion of the vehicle connector 26 may be included.

The clamp portion 52 may include opposed fingers 54-56 defining an opening therebetween for receipt of the vehicle connector 26. The clamp portion 52 may be bendable, with a crimp tool or other feature, to compressively connect to the outer portion of the vehicle connector 26. This connection may help reduce vibratory susceptibility of the connector as some or most of the vibration and forces may be directed more towards the terminal adapter 20 as opposed to the shunt 40 and its connections. The terminal adapter 20 directly supports the vibrations and the forces from the vehicle connector 26 by means of the mechanical connection done between these two elements.

Optionally, to provide insulation between the vehicle connector 26 and the terminal adapter 20 a non-conducting insulator may be included on the vehicle connector 26, as shown. An additional insulator may be used in conjunction therewith or in place thereof. For example, a shrink wrap material may be applied around the vehicle connector 26 and compressed for a snug fit by heating. The wrap may provide insulation to the conduction portion of the vehicle connector 26 and/or additional insulation, such to a cover a gap between where the shunt 40 connects to the conducting portion and where the terminal adapter 20 connects to the non-conducting portion of the vehicle connector 26.

The clamp portion 52 is shown to include the opposed fingers 54-56 for exemplary purposes only. The clamp portion 52 may include any shape or configuration suitable to providing a compressive or other connection between the terminal adapter and the vehicle connector 26. For example, the clamp portion 52 may include a C-shaped configuration where the outer portions of the C-shape are compressed against the vehicle connector 26. Furthermore, the clamp portion 52 may be replace with a separate piece, such as with a secondary clamp, that may be attached after manufacturing the terminal adapter 20 and at the time of attaching the vehicle connector 26 thereto. Such as two-piece construction may ease manufacturing costs and permit use of the terminal adapter with differing sized vehicle connector 26.

Figure 5:
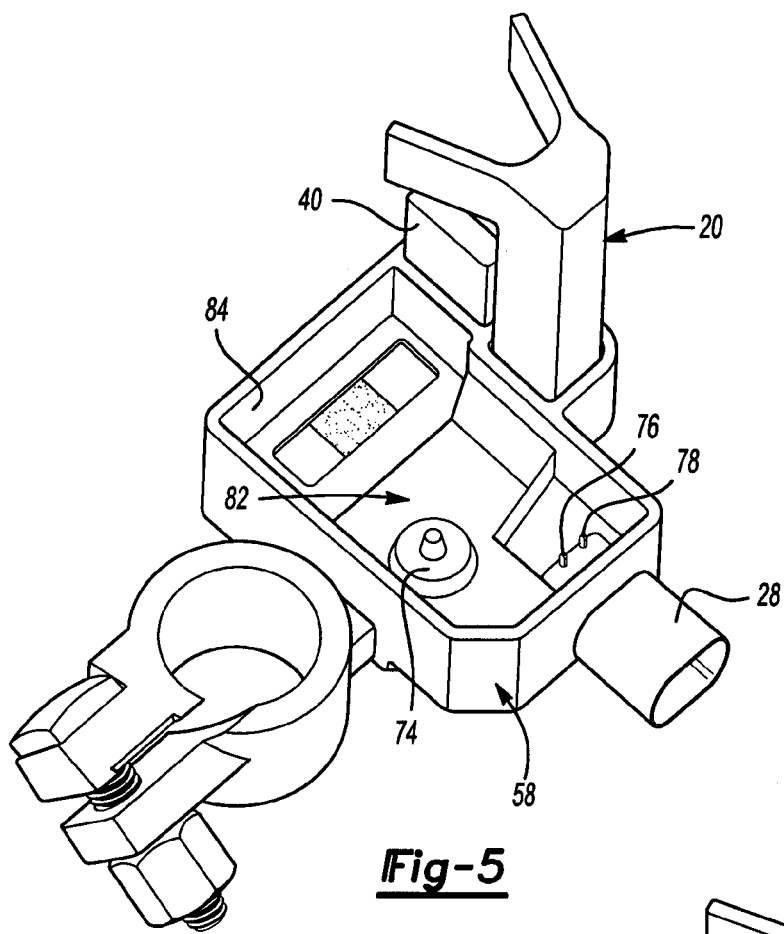
FIG. 5 illustrate a housing in accordance with one non-limiting aspect of the present invention.

FIG. 5 illustrate a housing 58 in accordance with one non-limiting aspect of the present invention. The housing 58 may comprise a non-conducting material configured for covering a portion of the terminal adapter 20 and shunt 40 extending between the battery post 14 and the vehicle connector 26. As shown in FIG. 1, the housing 58 may extend around an underside of the terminal 20 and shunt 40 such that the housing 58 covers the underside of the terminal and shunt. The housing 58 maybe fastened to the other outwardly extending portion 38 of the terminal adapter 20 such that the adapter 20 supports the undersides of shunt 40 and a portion of the housing 58. The housing 58 may be used to electrically isolate the shunt and terminal adapter.

Figure 6:
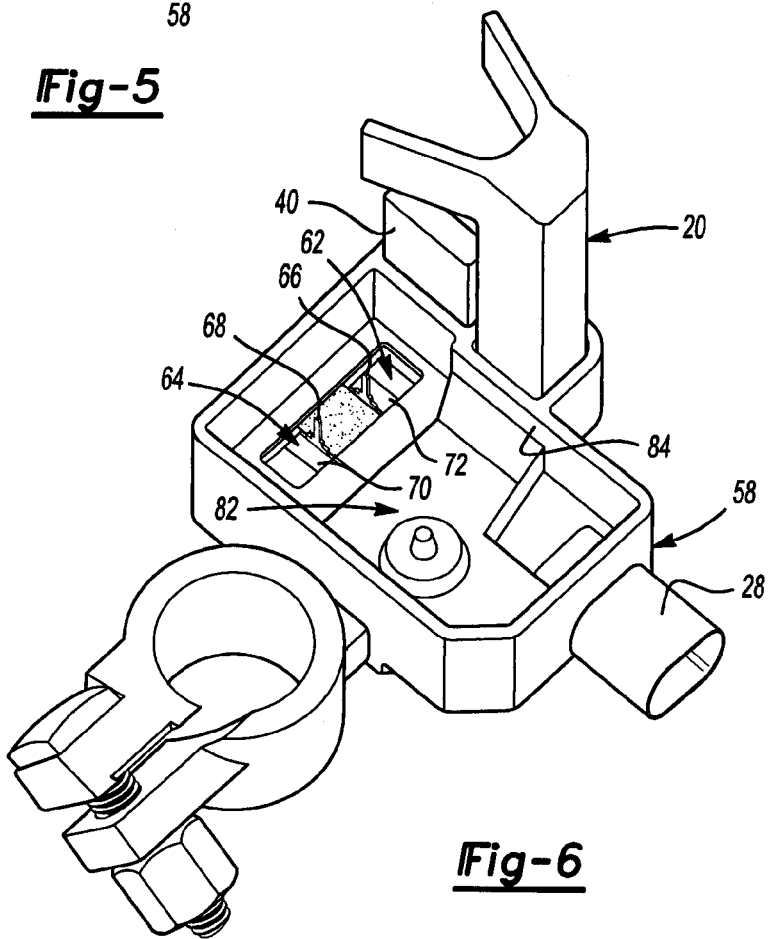
FIG. 6 illustrates connection tabs in accordance with one non-limiting aspect of the present invention.

FIG. 6 illustrates connection tabs 62-64 in accordance with one non-limiting aspect of the present invention. The connection tabs 62-64 may be viewed through an opening in the housing used to expose the shunt 40. The tabs 62-64 may be welded or otherwise electrically secured to a top portion of the shunt 40. The tabs 62-64 may include a shoulder or other offset 66-68 to facilitate offsetting element or other items place over top of the tabs 62-64. The tabs 62-64 may include footprints 70-72 extending over a portion of the copper portions of the shunt 40 to facilitate measuring the voltage drop across the manganin portion.

Figure 7:
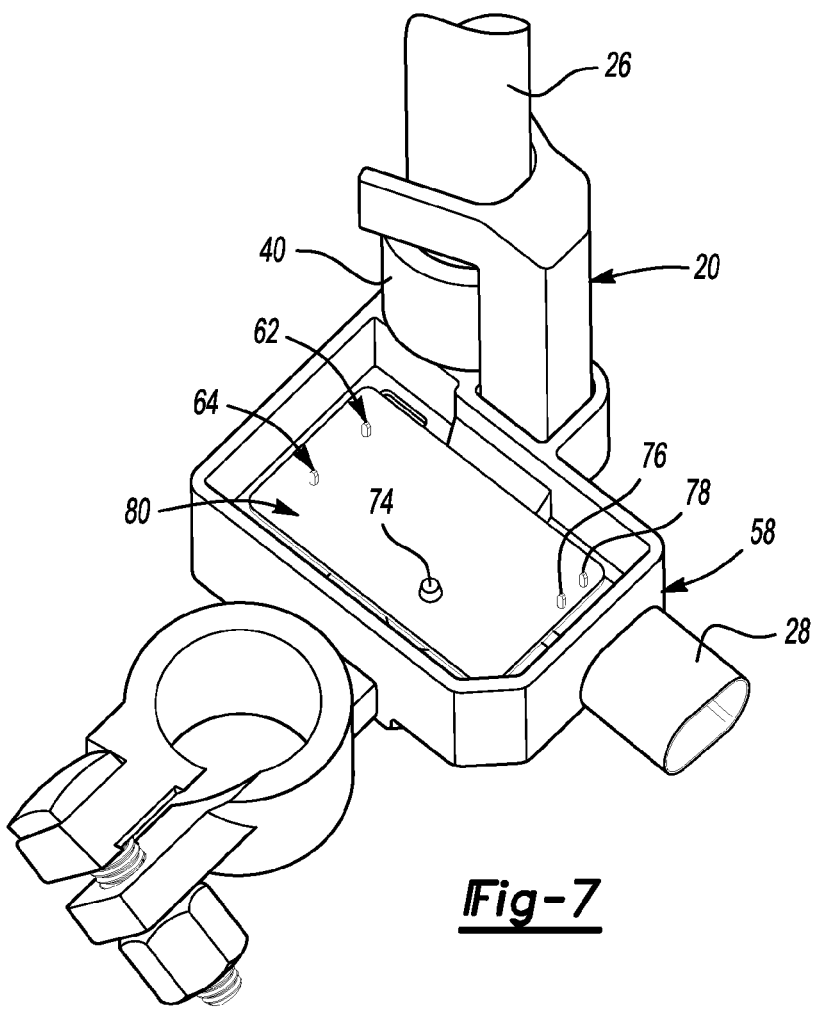
FIG. 7 illustrates a printed circuit board (PCB) in accordance with one non-limiting aspect of the present invention.
Figure 8:
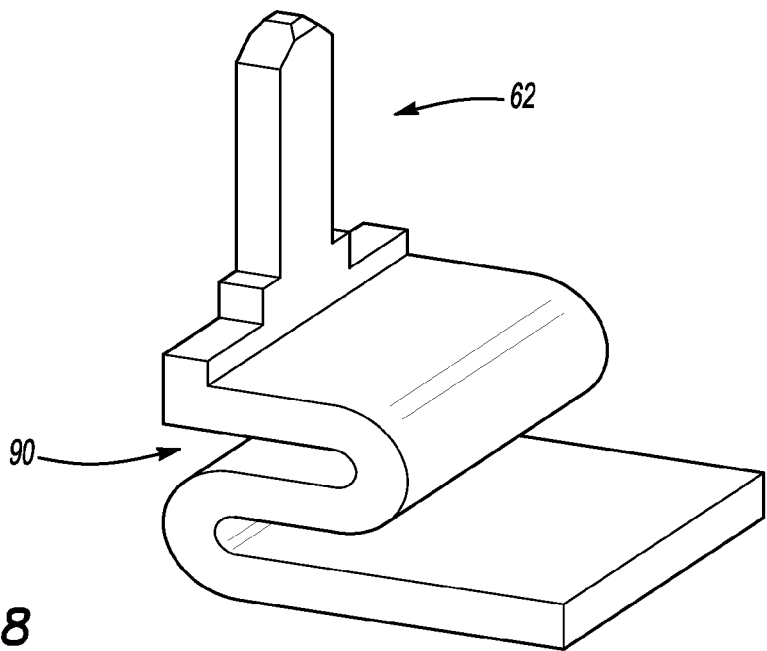
FIG. 8 illustrates connection tabs in accordance with one non-limiting aspect of the present invention.

FIG. 8 illustrates connection tabs 62-64 in accordance with one non-limiting aspect of the present invention. The connection tab 62, as shown in FIG. 8, may be configured with an s-shaped portion 90. The shaped portion 90 may be used to ameliorate strain produced by the thermal stress coming from the elements when connected. In more detail, during the performance of the connector 12, different temperatures on the components due to the differences on the electrical resistance (manganin portion has a resistance ten ways higher than the copper) produces different elongations on the shunt 40 and the PCB 80 (see below with respect to FIG. 7), and this strain could damage the connections. The spring effect of the shaped portion 90 helps minimize this effect.

In addition to the opening for the shunt 40, the housing 58 may include other openings and features to facilitate other operations associated with the present invention. The housing 58 may include an opening for receiving a terminal tab 74 of the terminal adapter 20. The terminal tab may extend through a topside of the housing 58. A pair of pins 76-78 may be integrated with the housing 58 to facilitate the electrical connection with the network adapter 28.

FIG. 7 illustrates a printed circuit board (PCB) 80 in accordance with one non-limiting aspect of the present invention. The PCB 80 may include any number of sensors and circuitry to perform any number of logical functions associated with determining the operating conditions of the battery or other operations associated with or based on the connector 12 and its function and performance. For example, the PCB 80 may include a temperature sensor (not shown) for sensing connector temperature and/or battery temperature directly from the terminal tab 74, which is helpful in providing a direct reading of temperature from the terminal adapter 20.

The temperature sensor may be used to sense the battery temperature as a function of the terminal adapter temperature. This may include establishing a thermal coupler or other element between the terminal adapter and the PCB so as to facilitate temperatures sensing. A negative or positive temperature coefficient element may be include proximate the thermal coupler to facilitate sensing the temperature. The PCB 80 is illustrated for exemplary purposes and without intending to limit the scope and contemplation of the present invention. The present invention fully contemplates the use of any type of logically functioning processing element, such as but not limited to a discrete or integrated circuit, having properties sufficient to facilitate determining battery operating conditions, which may or may not be include on a PCB.

The PCB 80 may fit within the exposed top side of the housing 58 for electrical communication with the shunt tabs 62-64, adapter tab 74, and connector pins 76-78. The PCB 80 may rest on the shoulders 66-68 of the tabs 62-64 such that a portion of the tabs 62-64 extend through a top side of the PCB 80. The housing 58 may include a raised portion 82 for offsetting the shunt tabs 62-64 and connector pins 74-76 from the underside of the PCB 80 while also supporting the same. The housing 58 may include side walls 84 raised above the PCB 80 for protecting the PCB 80. The tabs and pins may be soldered or otherwise electrically secured to the PCB 80 to establish an electrical connection thereto.

A non-conducting resin 86 (see FIG. 2) may be filled in above the PCB 80 and within the side walls 84 to vibrationally and electrically isolate and waterproof the PCB 80. The resin 86 may be beneficial in to enhancing system integrity against contaminates, water, debris, etc. and/or to facilitate packaging and other component design. The resin 86 may comprise any suitable material and be used to encase the connector features in a waterproof mold. The mold may further enhance the electrical isolation of the connector and provide extra protection against vibration and during shock tests.

As demonstrated above, the present invention provides a robust connector suitable for use with vehicle batteries and other batteries. One aspect of the present invention relates to reducing vibratory susceptibility of the connector by crimping the terminal adapter to the non-conducting portion of the vehicle connector. Another aspect relates to reducing shock test susceptibility of the connector by encapsulating the PCB within a resin. Another aspect relates to reducing the thermal stress effects with the use of spring shaped tabs to connect the shunt to the PCB. Some or all of these aspect may be employed with the present invention without deviating from the scope and contemplation of the present invention.

As required, detailed embodiments of the present invention are disclosed herein; however, it is to be understood that the disclosed embodiments are merely exemplary of the invention that may be embodied in various and alternative forms. The figures are not necessarily to scale, some features may be exaggerated or minimized to show details of particular components. Therefore, specific structural and functional details disclosed herein are not to be interpreted as limiting, but merely as a representative basis for the claims and/or as a representative basis for teaching one skilled in the art to variously employ the present invention.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A battery post connector for a vehicle battery, the connector comprising:
   an electrically conducting terminal adapter connected at one end to a battery post of the vehicle battery and connected at another end to a non-conducting portion of a vehicle connector electrically connected to a vehicle element;
   an electrically conducting shunt connected at one end to the battery terminal adapter and connected at another end to a conducting portion of the vehicle connector;
   a processing element included on a printed circuit board (PCB) configured to calculate current flow of the vehicle battery as a function of a voltage drop across a portion of the shunt;
   a pair of tabs welded to a top portion of the shunt for electrically connecting the shunt to the processing element, the processing element relying on the tabs to determine the voltage drop across the portion of the shunt; and
   wherein the tabs have a S-shape.

2. The connector of claim 1 wherein ends of the tabs extend through a top side of a printed circuit board (PCB) of the processing element to electrically connect the shunt to the processing element.

3. The connector of claim 1 wherein the terminal adapter is compressively connected to an outer portion of the vehicle connector.

4. The connector of claim 3 wherein a clamp portion connects the terminal adapter to the non-conducting portion of the vehicle connector.

5. The connector of claim 4 wherein the clamp portion includes opposed fingers defining an opening therebetween for receipt of the vehicle connector, the clamp portion being bendable to compressively connect to the outer portion of the vehicle connector.

6. The connector of claim 4 wherein the clamp portion is separate from the terminal adapter prior to being connected thereto.

7. A battery post connector for a vehicle battery, the connector comprising:

an electrically conducting terminal adapter connected at one end to a battery post of the vehicle battery and connected at another end to a non-conducting portion of a vehicle connector electrically connected to a vehicle element;

an electrically conducting shunt connected at one end to the battery terminal adapter and connected at another end to a conducting portion of the vehicle connector;

a processing element include on a printed circuit board (PCB) configured to calculate current flow of the vehicle battery as a function of a voltage drop across a portion of the shunt;

a non-conducting housing configured for covering at least a portion of the terminal adapter and shunt extending between the battery post and the vehicle connector, the PCB located on an exposed top side of the housing to electrically isolate the PCB from the shunt and terminal adapter; and wherein the terminal adapter includes outwardly extending portions extending outwardly relative to a laterally extending portion connected to the battery post, the shunt and the outwardly extending portions for connecting to the shunt and supporting a bottom side of the housing.

8. The connector of claim 7 wherein the exposed top side of the housing includes side walls raised above the PCB, a non-conducting resin filled above the PCB and within the side walls to electrically isolate and waterproof the PCB.

9. A battery post connector for a vehicle battery, the connector comprising:

an electrically conducting terminal adapter connected at one end to a battery post of the vehicle battery and connected at another end to a non-conducting portion of a vehicle connector electrically connected to a vehicle element;

an electrically conducting shunt connected at one end to the battery terminal adapter and connected at another end to a conducting portion of the vehicle connector; and wherein the terminal adapter includes a laterally extending portion extending relative to the battery post and a downwardly extending portion extending downwardly relative to the laterally extending portion, the shunt having corresponding laterally and downwardly extending portions, the vehicle connector connecting to the shunt and the terminal adapter at the respective downwardly extending portions, the laterally and downwardly extending portions shaped to correspond with a shape of the vehicle battery such that the connector lies flat against a top portion and side portion of the vehicle battery.

10. A battery post connector for use in determining current flow of a vehicle battery, the connector comprising:

an electrically conducting terminal adapter connected at one end to a battery post of the vehicle battery and connected at another end by way of a clamp to a portion of a vehicle connector electrically connected to a vehicle element;

an electrically conducting shunt connected at one end to the battery terminal adapter and connected at another end to the vehicle connector;

a processing element configured to calculate current flow of the vehicle battery as a function of a voltage drop across a portion of the shunt; and wherein the clamp is separate from the terminal adapter.

11. The connector of claim 10 wherein the clamp includes opposed fingers defining an opening therebetween for receipt of the vehicle connector, the fingers compressing around the vehicle connector to connect the terminal adapter thereto.

12. The connector of claim 10 wherein the terminal adapter is connected to a non-conducting portion of the vehicle connector and the shunt is connected to a conducting portion of the vehicle connector.

* * * * *